United States Patent [19]
Biegelsen et al.

[11] Patent Number: 5,521,931
[45] Date of Patent: May 28, 1996

[54] NONMONOLITHIC ARRAYS OF ACCURATELY POSITIONED DIODE LASERS

[75] Inventors: David K. Biegelsen, Portola Valley; Ross D. Bringans, Cupertino; R. Donald Yinling, deceased, late of San Francisco, by David G. Williamson, executor; Thomas L. Paoli, Los Altos; Eva E. Taggart, Saratoga; William J. Mosby, San Jose; Gregory J. Kovacs, Sunnyvale, all of Calif.

[73] Assignee: Xerox Corporation, Stamford, Conn.

[21] Appl. No.: 156,227

[22] Filed: Nov. 22, 1993

[51] Int. Cl.$^6$ ............................... H01S 3/04; H01S 3/045
[52] U.S. Cl. ........................................ 372/36; 372/50
[58] Field of Search ................................ 372/36, 50

[56] References Cited

U.S. PATENT DOCUMENTS

| | | | |
|---|---|---|---|
| 3,590,248 | 6/1971 | Chatterton | 372/36 |
| 4,818,099 | 4/1989 | Preikschat et al. | 372/36 |
| 4,901,325 | 2/1990 | Kato et al. | 372/44 |
| 5,086,431 | 2/1992 | Hardy et al. | 372/36 |
| 5,099,488 | 3/1992 | Ahrabi et al. | 372/36 |
| 5,105,429 | 4/1992 | Mundinger et al. | 372/36 |

Primary Examiner—Rodney B. Bovernick
Assistant Examiner—Robert E. Wise
Attorney, Agent, or Firm—John M. Kelly

[57] ABSTRACT

Nonmonolithic laser arrays having a plurality of lasing elements mounted on one or more spacers which protrude from a thermally conductive support. The spacers ensure the accurate location and separation of the lasing elements, facilitate the orientation of the output laser beams, and enable low thermal, optical, and electrical cross-talk between the lasing elements.

16 Claims, 7 Drawing Sheets

NONMONOLITHIC ARRAYS OF ACCURATELY POSITIONED DIODE LASERS

The present invention relates to nonmonolithic laser arrays, their fabrication, and their assembly.

BACKGROUND OF THE PRESENT INVENTION

The performance of many devices, such as laser printers and optical memories, can be improved with laser arrays having independently controlled lasing elements. For example, laser printers which use an array of lasing elements can have higher printing speeds and better spot acuity than printers with only a single lasing element. In many applications it is important that the array's lasing elements be accurately positioned and oriented.

Monolithic laser arrays usually output light beams having the same wavelength. Typically, that wavelength can only be varied over a small range. However, in some applications, including color printing, it is desirable to output multiple wavelengths that span a wide wavelength range; for example, from the infrared through the visible. In color printing this enables one to match the output laser characteristics to photoreceptor response windows, or to separate overlapping laser beams after scanning by the use of dichroic filters. In other applications it may be desirable to emit multiple laser beams with different polarizations or spot profiles. Finally, it is almost always desirable to have low electrical, optical, and thermal crosstalk between lasing elements.

As compared to present day monolithic laser arrays, nonmonolithic laser arrays can provide a greater range of laser beam characteristics (such as wavelength, polarization and spot sizes) and have lower electrical, optical, and thermal crosstalk. Because of these advantages, there is a need for nonmonolithic laser arrays.

A nonmonolithic laser array usually consists of a plurality of individual laser diodes mounted on a support. Since in many applications the output laser beams must be accurately spaced, the supports for the lasing elements should enable the accurate positioning of the lasing elements. Ideally, the supports should not detract from the advantages of nonmonolithic laser arrays.

Prior art nonmonolithic semiconductor laser arrays usually use planar supports. Laser alignment involves external manipulations of the lasing elements onto the support. Prior art planar laser arrays have a major problem with how close lasing elements can be spaced. Laser stripes are generally placed at the center of the chip to avoid damage to the stripes during cutting of the wafer from which the laser is produced. This limits the achievable minimum spacing between lasing elements if those elements are placed on a common planar substrate.

Kato et al., U.S. Pat. No. 4,901,325, teaches a non-planar nonmonolithic laser array suitable for use with closely spaced lasing elements. A simplified view of that support is shown in FIG. 1. While the support 10 (with a spacer 12) enables the lasing elements 14 to be spaced within microns, absolute control of the lasing element spacing (how close the lasing elements are to their desired location) is not provided for. Further, the orientations of the lasing elements are not rigidly controlled.

Thus, there exists a need for methods and devices that enable close, accurate spacing of lasing elements in a nonmonolithic laser array without excessive thermal, optical, and/or electrical cross-talk. Such methods and devices are even more desirable if they permit the accurate orientation of the lasing elements.

SUMMARY OF THE INVENTION

The present invention provides for nonmonolithic laser arrays comprised of lasing elements attached to a support that ensures the accurate location and separation of the lasing elements, that enables low thermal cross-talk, and that facilitates low electrical cross-talk.

The support is comprised of a base from which one or more thermally conducting spacers having lasing element mounting surfaces protrude. The thickness of the spacer controls the separation between the lasing elements. Beneficially, the laser stripes (light output regions) are mounted adjacent the spacers.

If the support base and/or spacer are electrically insulating, an electrically conductive material is beneficially deposited over one or more of the external surfaces of the base and/or spacer to enable current flow to the lasing elements mounted on the spacers.

Heat generated by the lasing elements flows down the spacer and into the base, which is beneficially heatsinked. The spacer is sufficiently thermally conductive that heat flows sufficiently quickly to the base that thermal flow between the lasing elements is nominal.

While the spacer should be shaped to meet its particular application, in many cases the spacer will form a T with the base. If the support is T-shaped, and if the lasing elements mount near the interior corners of the T, the interior corners may be relieved to reduce interference with the lasing elements. Alternatively, to eliminate the need for reliefs, the lasing elements may be mounted to the spacer with an electrically insulating film between the base and each lasing element.

In other applications, the need for reliefs are eliminated by mounting one or more of the lasing elements above the support and in physical contact with only one surface of the spacer.

The present invention may be practiced with more than two lasing elements on a spacer. For example, the spacer may be cross-shaped and lasing elements may be mounted adjacent to each inner corner of the cross.

Other embodiments of the present invention which have more than two lasing elements may have the lasing elements aligned along a planar base. In one such embodiment, the array is formed from lasing elements arranged in abutting pairs, with the lasing elements in each pair sharing an electrically and thermally conductive grounded support, and with the individual pairs being separated by thermally conductive, but electrically insulating, supports. Current flow is achieved by having each lasing element independently connected to one terminal of an associated current source, and by having the returns of the various associated current sources connected to the grounded supports. Additional insulating supports are provided at each end of the array. Alternatively, the lasing elements in a pair may be separated by thermally conductive, but electrically insulating supports, while the pairs may be separated by thermally and electrically conductive grounded supports. Additional grounded supports are then provided for each end lasing element. In both configurations, heat generated in the lasing elements passes into the base, at least partially via the supports.

BRIEF DESCRIPTION OF THE DRAWINGS

Other aspects of the present invention will become apparent as the following description proceeds and upon reference to the drawings, in which.

The following descriptions use directional signals (such as right, left, up, down) which are taken relative to the drawings. Those directional signals are meant to aid the understanding of the present invention, not to limit it.

DETAILED DESCRIPTION OF THE ILLUSTRATED EMBODIMENTS

Figure 1:
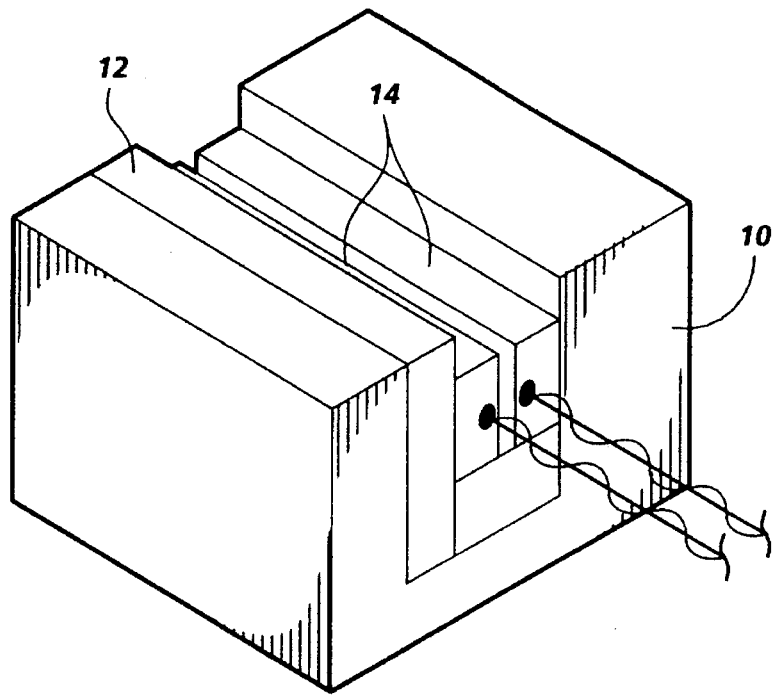
FIG. 1 illustrates a prior art nonmonolithic laser array.
Figure 2:
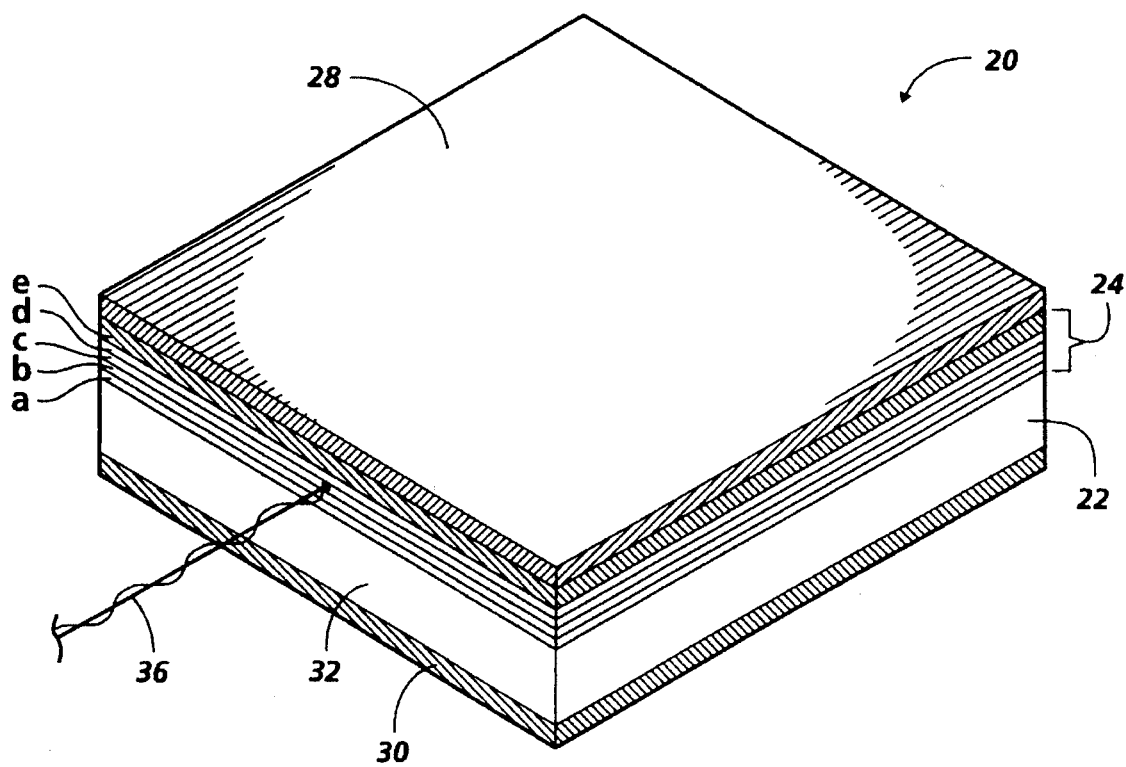
FIG. 2 illustrates a lasing element suitable for use with the various illustrated embodiment laser arrays.

A typical lasing element as used in the subsequently described embodiments is the semiconductor diode laser 20 illustrated in FIG. 2. The diode laser 20 is comprised of a substrate 22 doped to one electrical type (say n-type) having an overgrown multiple section epitaxial layer 24. The epitaxial layer 24 is comprised of 5 epilayers, 24a through 24e. The layers 24a and 24b are n-type; layers 24d and 24e are p-type; and layer 24c is undoped. The various epilayers serve to confine the recombining carriers and the resulting emitted photons. An electrode layer 28 is formed over the layer 24. The electrode layer 28 can be patterned, or the material in layer 24 can be modified (for example by layer disordering or reverse doping), to confine the input current as required. A second electrode layer 30 is formed over the bottom of the substrate. The diode laser 20 is constructed such that current applied via the electrode layers 28 and 30 causes the diode laser to emit light from a lasing area.

As is well known, a diode laser requires optical reflectors, usually implemented as cleaved facets, for operation. The optical reflector arrangement for the diode laser 20 is achieved using cleaved end faces 32 (only one of which is shown) which form a cavity for stimulated emission. During lasing, a laser beam 36 is emitted from the end face 32.

To achieve the maximum spacing and positioning accuracy of the laser outputs the lasing elements 20 are mounted on the supports (described below) with the electrode layer 28 in electrical contact with the supports. This is advantageous because the thicknesses of the epilayers 24a through 24e and the thickness of the electrode layer 28 are easier to control than the substrate thickness. Additionally, since the layers 24a through 24e and the layer 28 are very thin (about 2 µm, inclusively), when mounted in this manner the laser beam outputs are very close to the supports. Thus, laser beam separation is essentially equal to the thickness of the support. Finally, mounting the lasing elements in this manner places the heat generating epilayers in good thermal contact with the support, thereby improving heat transfer. For clarity, the following figures illustrate the lasing regions as dark ovals.

A FIRST EMBODIMENT OF THE PRESENT INVENTION

Figure 3:
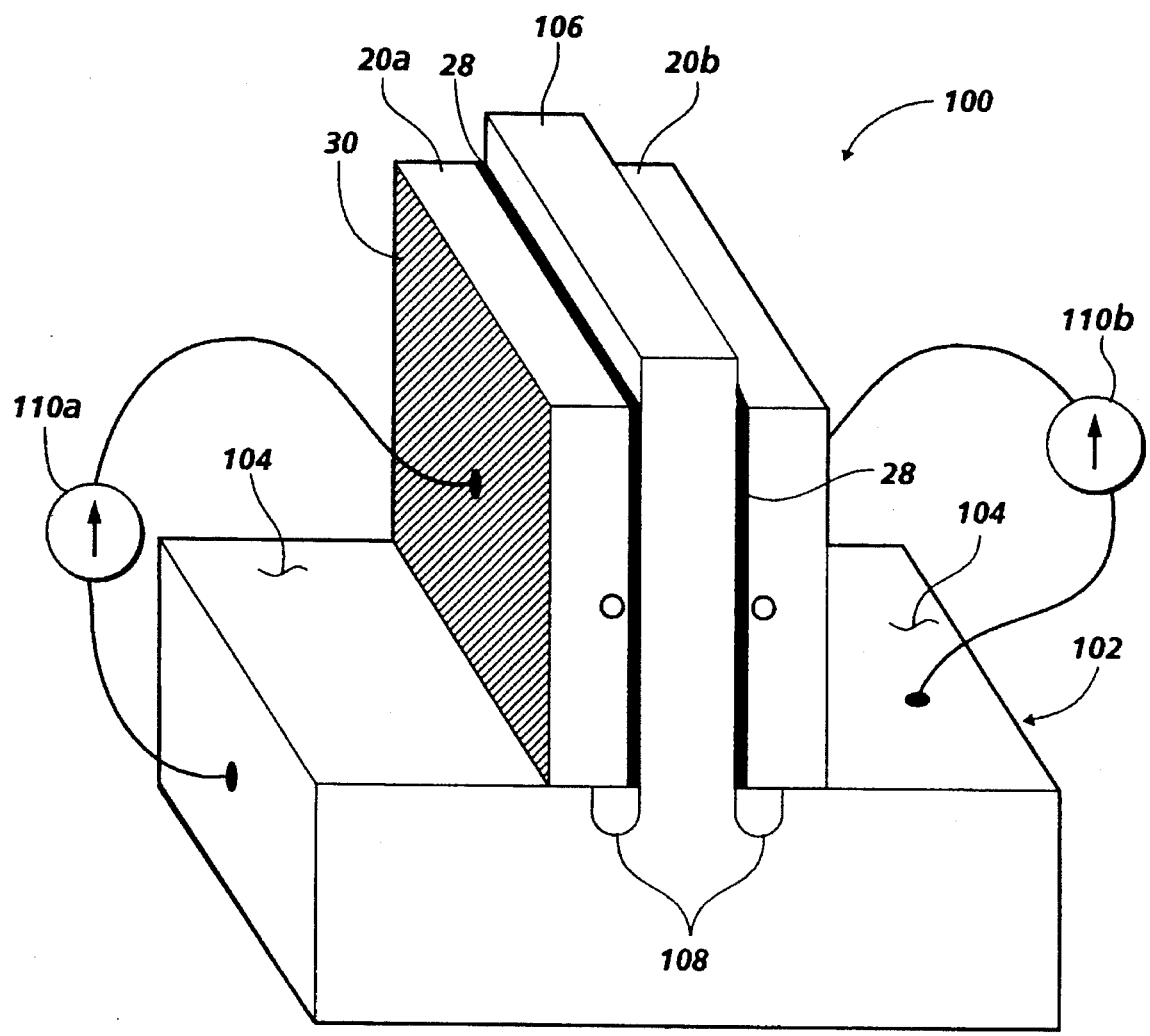
FIG. 3 is a simplified perspective view of a first embodiment laser array in accordance with the principles of the present invention.

Refer now to FIG. 3, which shows a nonmonolithic laser array 100 according to a first embodiment of the present invention. As shown, the array 100 consists of two lasing elements 20, designated 20a and 20b, mounted on a support 102. The support 102 is a T-shaped structure comprised of a base 104 and a protruding spacer 106, both made of thermally and electrically conductive material. Illustratively, the support 102 may be doped silicon, copper, gold, or aluminum. The lasing elements mount on the support 102 such that 1) they are in thermal contact with the support, and 2) their electrode layers 28 are in electrical contact with the spacer 106. Beneficially, the bottoms of the lasing elements 20a and 20b may be coated with an insulating layer such as silicon nitride to avoid shorting to the base 104.

As shown in FIG. 3, the support includes reliefs 108 where the corners of the lasing elements meet the corners formed by the spacer/base. The reliefs reduce interference between the inner corners of the support and a lower corner of the lasing elements. While the reliefs are shown as running vertically, they may also be circular or they may run horizontally. However, the width of the relief should be considerably less than the thickness of the laser chips (about 75–100 µm in the described embodiment).

The support 102 may be micro-machined using multiple passes of a single diamond-charged saw blade, or it may be machined using a single pass of a properly shaped saw blade or grinding tool. The goal is to produce a vertical spacer 106 having flat sides and a flat top surface.

OPERATION OF THE FIRST ILLUSTRATED EMBODIMENT

Still referring to FIG. 3, in operation, electrical currents from current sources 110a and 110b are applied to the lasing elements 20a and 20b, respectively. The support 102 serves as a conductor for both current sources. Considering now only lasing element 20a, current from the current source 110a is applied to the conductive layer 30. That current passes through the lasing element 20a, causing it to emit light, flows into and down the spacer 106 to the base 104, and from the base back to the current source 110a. The lasing element 20b operates similarly with respect to its current source 110b. As will be appreciated, the conductive layer 30 must not contact the support 102. One method of accomplishing the required electrical isolation is to form the conductive layer 30 only over part of the surface of the lasing elements.

The above description of operation described using the spacer as a current conductor. Such use of the spacer is beneficial when producing arrays with small separations between the lasing elements. A conductor attached to the current source could be disposed between the lasing element's conductive layer 28 and the spacer 106 to provide a current return.

Current flow through the lasing elements generates heat. That heat flows down the spacer 106, and thus away from the opposed lasing element, and into the base 104. In practice the support 102 is heatsinked and heat flows quickly out of the base. As heat is conducted away from the lasing elements, the chance of thermal run-away of a lasing element is reduced, as is the thermal cross-talk between the elements.

As will be appreciated, the thermal conductivity of the support 102 must be sufficiently high that heat produced by the lasing elements readily passes to an external heatsink (not shown). As an example of what can be achieved, a properly heatsinked silicon support having a spacer about 500 µm high and 150 µm thick is sufficient to maintain thermal crosstalk below 4%, where crosstalk is defined as the percentage change in output power of one laser when the other laser is turned on.

Each of the embodiments described herein operates electrically and thermally similar to the above. After reading the above descriptions, those skilled in the applicable arts will readily understand the operation of all of the described embodiments. Thus, the descriptions of operation will not be repeated.

A SECOND ILLUSTRATED EMBODIMENT

Figure 4:
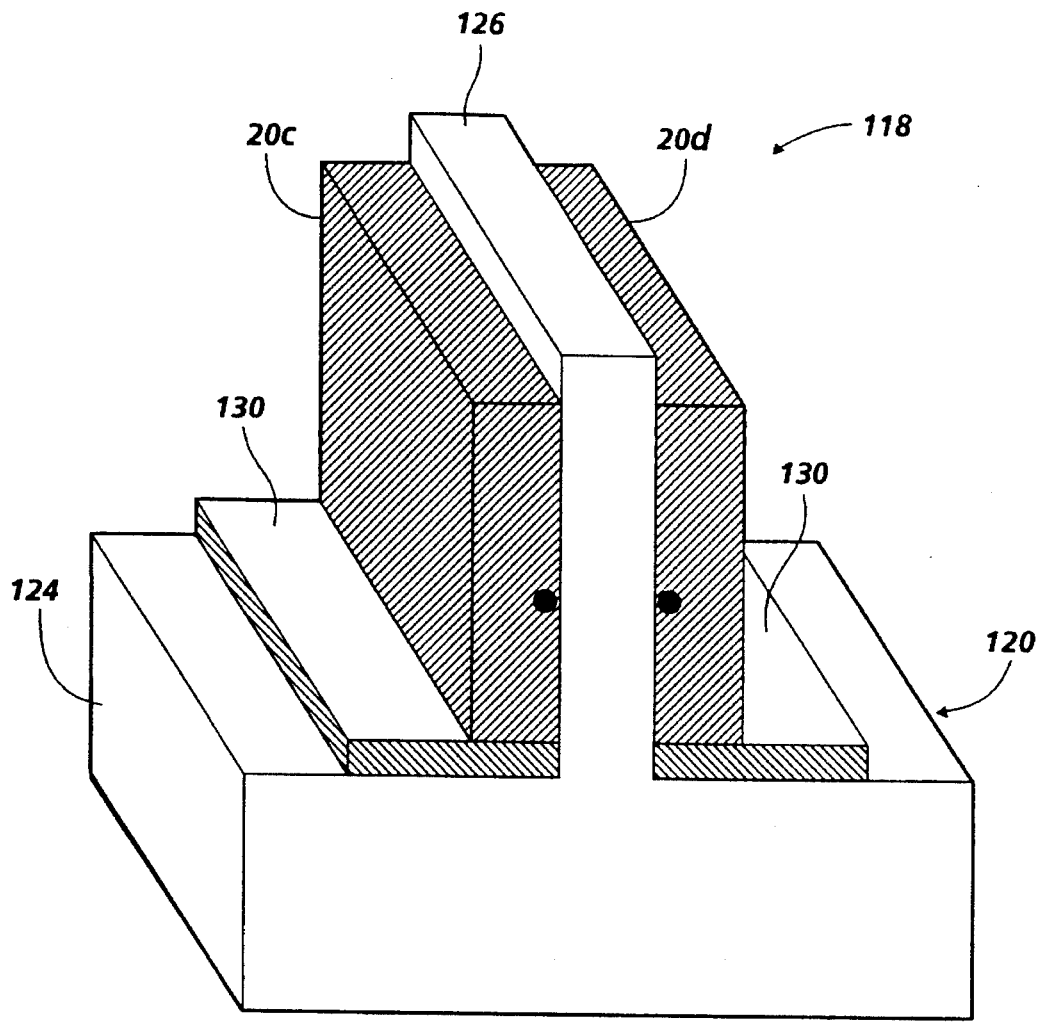
FIG. 4 is a simplified perspective view of a second embodiment laser array in accordance with the principles of the present invention.

Many modifications to the basic T shaped support 102 shown in FIG. 3 are possible. For example, FIG. 4 shows a second embodiment nonmonolithic laser array 118, also according to the present invention. The array 118 has two lasing elements 20, designated 20c and 20d, mounted on a T-shaped support 120. The support 120 includes a base 124 and a spacer 126, both made of thermally and electrically conductive material. However, the support 120 does not have reliefs (see FIG. 3, items 108) as does the support 102. Rather, the lasing elements are spaced above the radius of the spacer/base corners by electrically insulating strips 130. Illustratively, the strips 130 are 10–20 µm thick mylar sheets. The strips prevent interference between the corners of the lasing elements and the corners formed by the spacer/base interfaces. Further, the strips prevent electrical shorting of the conductive layers 30 of the lasing elements and assist heat flow from the lasing elements to the base 124. Because the support 120 does not have reliefs, it is somewhat easier to fabricate than the support 102. However, the additional step of installing the strips 130 is required.

AN ALTERNATIVE SUPPORT STRUCTURE

In the second embodiment of the present invention (FIG. 4) the lasing elements are mounted above the radius of the spacer/base corners. Thus, reliefs are not required. While the support 120 can be fabricated in a manner similar to the support 102 (by material removal), an alternative method may be better in some applications.

Figure 5:
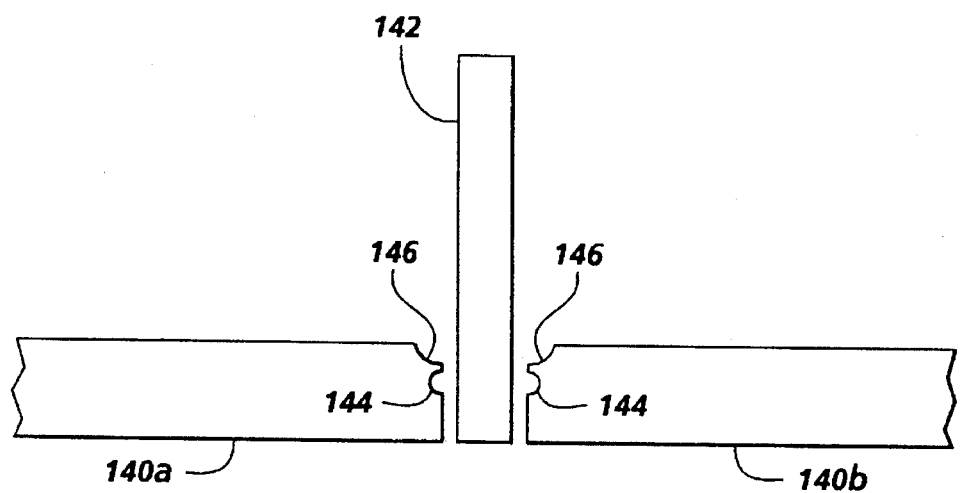
FIG. 5 helps illustrate a method of fabricating an alternative support useful in practicing the present invention.

FIG. 5 helps illustrate the alternative method. The method involves joining two base pieces, 140a and 140b, of a thermally conductive material to a protruding element 142, also of a thermally conductive material. The protruding member is placed between the two base pieces, and all three parts are then soldered together. It is beneficial to use a high melting temperature solder, such as In-Sn, when soldering to avoid problems when the lasing elements are soldered to the spacers (see below).

As shown in FIG. 5, the base pieces include receptacles 144 that provide volumes for receiving capillary overflow of the solder used to join the elements together. The base pieces also include relief grooves 146 for reducing interference between the base and the lasing elements. Of course, the relief grooves and receptacles are not always required, and if used, the receptacles may be formed in the protruding element 142.

A THIRD ILLUSTRATED EMBODIMENT

Figure 6:
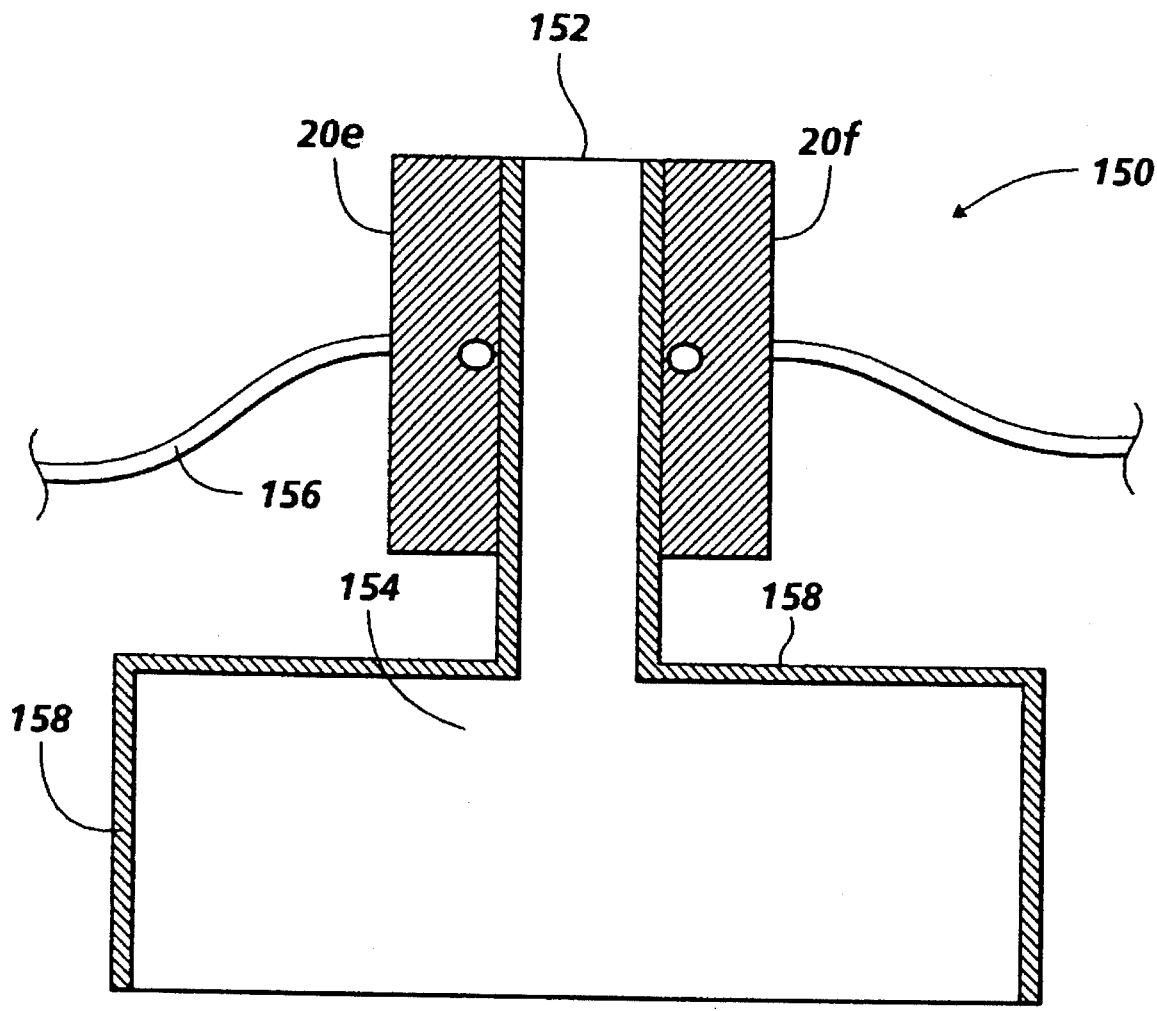
FIG. 6 is a simplified plan view of a third embodiment laser array in accordance with the principles of the present invention.

A third T-shaped laser array 150, also in accord with the present invention, is shown in FIG. 6. The laser array 150 differs in two major respects from the laser arrays 100 and 118 (FIGS. 3 and 4, respectively). First, the laser array 150 has lasing elements 20, designated 20e and 20f, mounted on a spacer 152 above the radius of the spacer/base corners, and thus the lasing elements do not contact the base 154. Spacing the lasing elements in this manner reduces the possibility of shorting across the laser diode layers without requiring strips 130 (FIG. 4). Further, by spacing the lasing elements far enough above the base 154 that the radius of the spacer/base corners are not a problem, reliefs are not needed.

The second major difference between the laser array 150 and the laser arrays 100 and 118 is that the spacer 152 and the base 154 are electrically insulating. Electrically conductive paths for the lasing elements are provided by a thin conductive layer 158 deposited over the spacer and base. The use of an electrically insulating core with a conductive outer layer enables the fabrication of highly efficient structures using electrically insulating materials. For example, a very good support structure will have a spacer and base made of diamond, and a conductive layer of deposited gold. While such a diamond support would make a very effective support structure, it has the drawback of being relatively difficult and expensive to fabricate.

A FOURTH ILLUSTRATED EMBODIMENT

Figure 7:
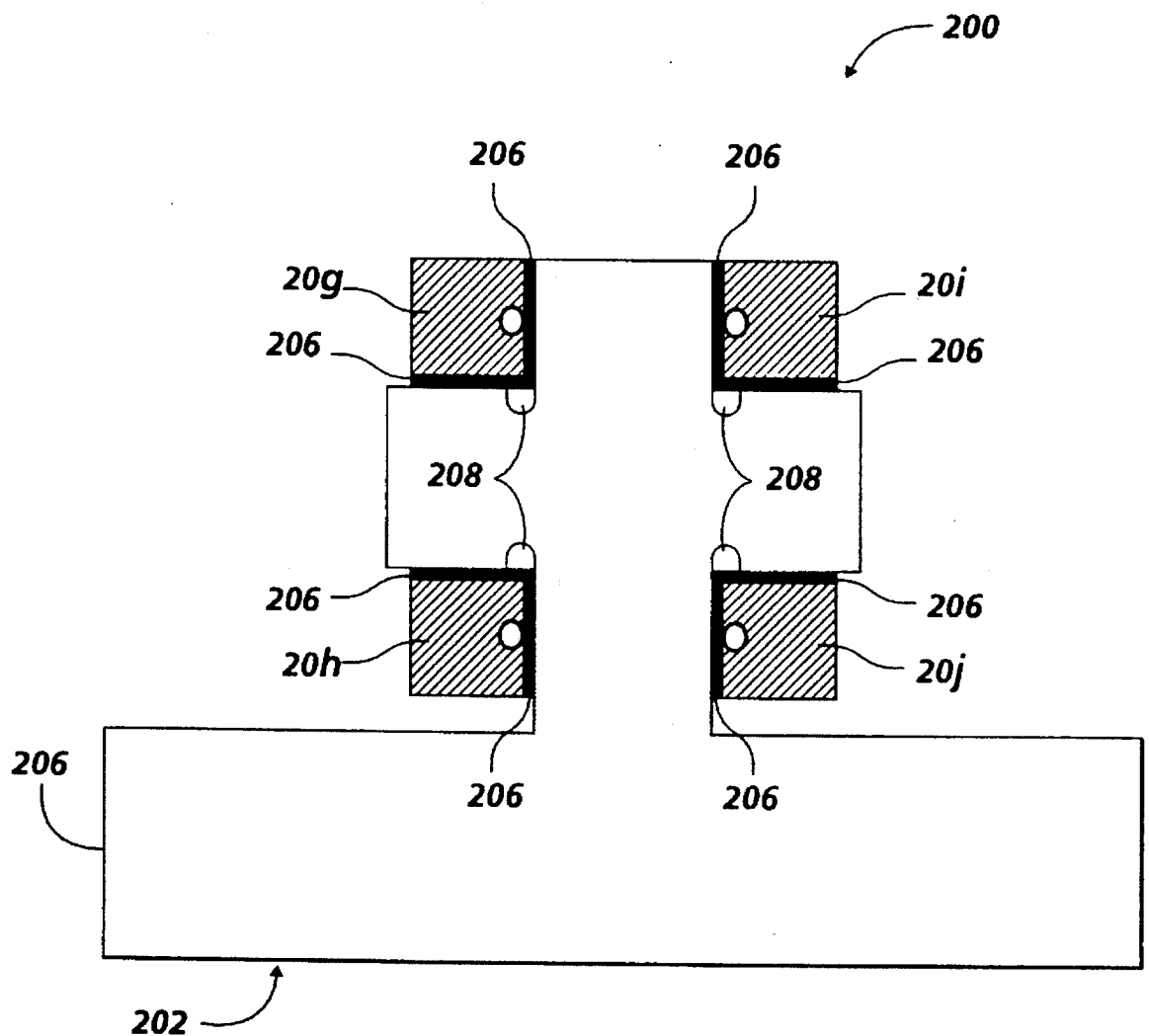
FIG. 7 is a plan view of a fourth embodiment laser array in accordance with the principles of the present invention.

The first, second, and third illustrated embodiments (FIGS. 3, 4, and 6, respectively) of the present invention are laser arrays having only two lasing elements. However, the principles of the present invention are readily extended to arrays having more than two lasing elements. For example, FIG. 7 illustrates an array 200 having four lasing elements 20, designated 20g through 20j mounted on a structure 202. The structure 202 is comprised of a cross shaped stand 204, on which the lasing elements mount, and a base 206. The structure 202 is beneficially machined from an electrically and thermally conductive material.

As shown in FIG. 7, the lasing elements have deposited insulation 206 (such as silicon nitride) on their sides and mount in the corners of the stand 204. Thus, the stand includes reliefs 208. Alternatively, the lasing elements may be mounted on strips similar to the strips 30 of FIG. 4, or they may be mounted on the stand away from the corners, as shown in FIG. 6. The fourth illustrated embodiment results in four very closely spaced lasing elements.

A FIFTH ILLUSTRATED EMBODIMENT

Figure 8:
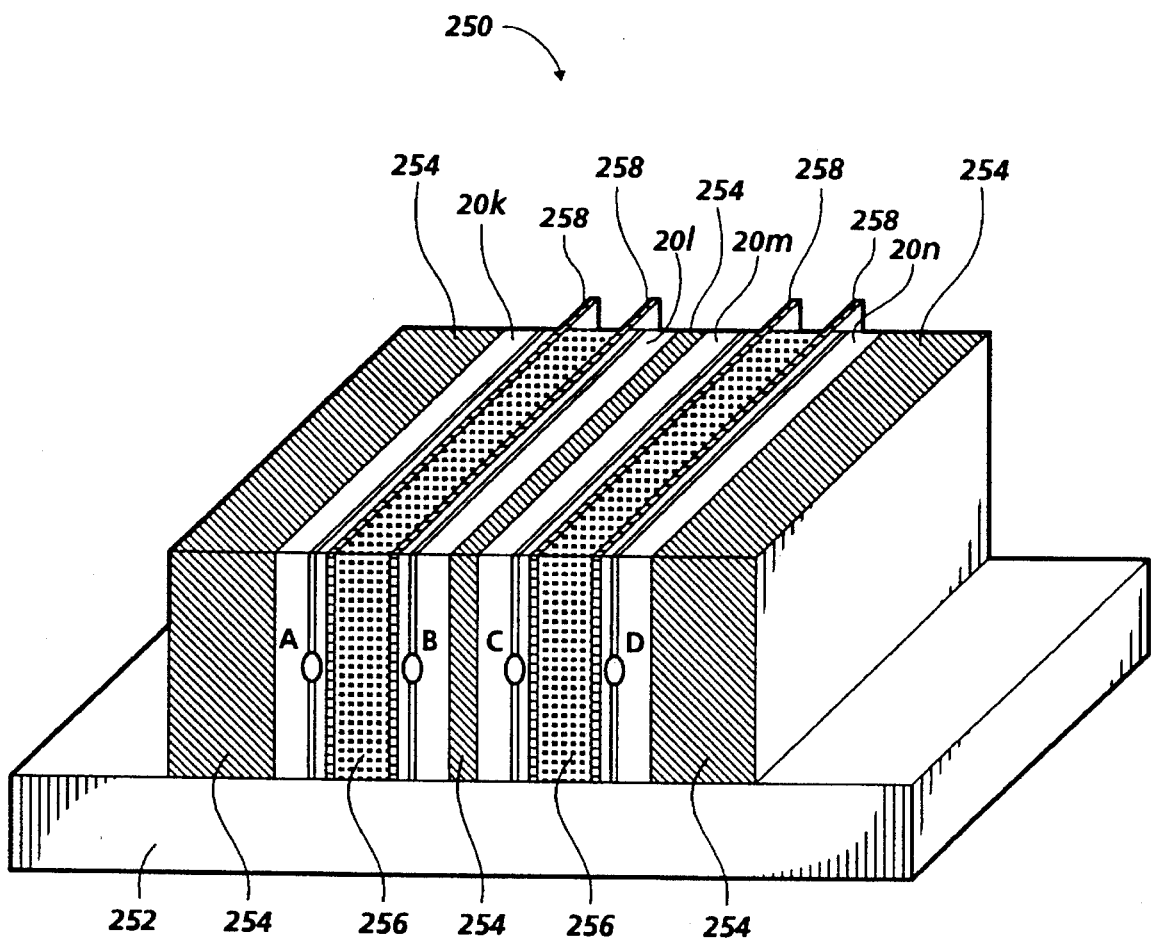
FIG. 8 is a perspective view of a fifth embodiment laser array in accordance with the principles of the present invention.

Linear arrays having more than two lasing elements are also possible according to the present invention. One such linear array is shown in FIG. 8. That array 250 is comprised of four lasing elements 20, designated 20k through 20n, aligned along an electrically and thermally conductive planar base 252. Close reference to FIG. 8 shows that the lasing elements 20 are arranged in pairs, with lasing elements 20k and 20l forming one pair, and lasing elements 20m and 20n forming a second pair. The pairs of lasing elements are sandwiched between an electrically conductive grounded support 254. Further, one grounded support 254 is at each end of the array 250. The individual lasing elements in each pair are separated by a thermally conductive, electrically insulating support 256.

Sandwiched between the insulating supports and each lasing element (but not in electrical contact with the base 252) is a thin, electrically conductive input 258. Alternatively, the inputs may be replaced by a metallic deposition on the lasing elements or on the insulating supports 256. The grounded supports 254 and the insulating supports 256 may be made from, respectively, doped and undoped semiconductor material, such as GaAs or Si. Except for the inputs 258, all of the other elements of the laser array 250 mount on the base 252. It is particularly important that 1) the base 252 electrically connect to the grounded supports 254 and 2) that the inputs 258 do not short out to the base.

The linear array 250 is beneficially fabricated by forming metalization deposits on the sides and bottom of each array component, and then soldering all of the array components together. It is very important that the lasing elements A,B, C,and D not short to the base or to each other.

A SIXTH ILLUSTRATED EMBODIMENT

Figure 9:
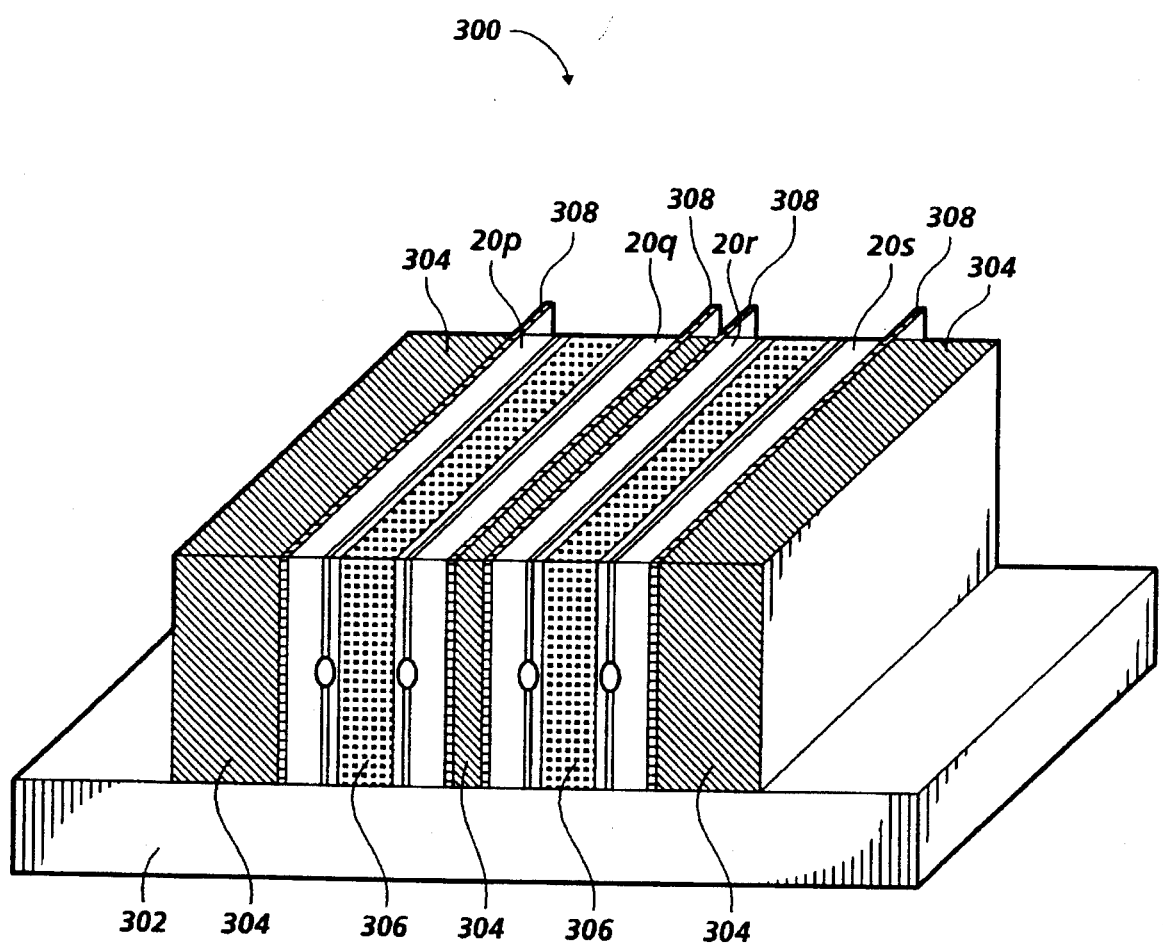
FIG. 9 is a perspective view of a sixth embodiment laser array in accordance with the principles of the present invention.

A laser array similar to the fifth illustrated embodiment may be formed by interchanging the grounded and insulating supports. Such a laser array is the laser array 300 shown in FIG. 9. That array has four lasing elements 20, designated 20p through 20s, aligned along a planar base 302. As in the fifth illustrated embodiment, the lasing elements 20 are arranged in pairs, with lasing elements 20p and 20q forming one pair, and the lasing elements 20r and 20s forming a second pair. The pairs of lasing elements are sandwiched between an electrically insulating and thermally conducting support 304, and additional electrically insulating but thermally conducting supports are placed on each end of the array 300. The individual lasing elements in each pair are separated by a thermally and electrically conductive grounded support 306.

Sandwiched between the insulating supports 304 and each lasing element is a thin, electrically conductive input 308. As in the fifth illustrated embodiment, all of the components of the array, except for the inputs 308, are mounted on the base 302. Again, it is particularly important that the base 302 electrically connect to the grounded supports 306, that the inputs 308 not short out to the base, and that there be no shorting across the lasing elements themselves.

SOLDERING THE LASING ELEMENTS INTO PLACE

Attachment of the lasing elements to the various supports is best performed using a low temperature solder, such as In. First, prior to soldering, the indium pellets used for soldering are immersed in a dilute hydrochloric acid solution for oxide removal. Then, the spacer's mounting surfaces are prepared for soldering by sputter deposition of a thin layer of nickel, followed by thin layer of platinum. Solder is then deposited onto the spacers using thermal evaporation of the indium pellets from tungsten boats. The objective is to deposit a film that is thick enough for planarization and wetting, but thin enough to allow insignificant material flow. A good In film thickness is around 2–2.5 μm. If used, electrical insulating strips (strips 130 in FIG. 4) are then laid down flush with spacer/base corners. Next, the lasing elements are brought into close proximity with the indium layer on the spacer and aligned. Then, using visual observation, the temperature of the spacer is raised above the melting temperature of the indium solder and the lasing elements 20 are pressed into place using a vacuum collet. The vacuum is then released, but physical pressure with the collet is maintained. The heating source is then turned off and a cooling nitrogen stream is applied to the lasing element. When the solder has solidified the pressure on the lasing element is released. Cooling to room temperature then continues.

The soldering procedure described above Can be modified to fit the particular application and materials. However, in all cases surface preparation should be performed carefully to ensure good, reliable thermal and electrical connections.

From the foregoing, numerous modifications and variations of the principles of the present invention will be obvious to those skilled in its art. Therefore the scope of the present invention is to be defined by the appended claims.

What is claimed:

1. A linear laser array, comprising:

a thermally conductive base;

at least two thermally conducting and electrically insulating supports in thermal contact with said base;

at least two pairs of lasing elements, each lasing element having first and second surfaces in electrical contact with a lasing region, and each pair of lasing elements comprised of two lasing elements disposed on opposing sides of one of said insulating supports such that said first surfaces are near said insulating supports;

at least four electrical contacts, each one of said contacts in electrical communication with a first surface of a single, associated lasing element, said electrical contacts disposed between its associated lasing element and one of said insulating supports;

a thermally and electrically conducting support disposed between pairs of lasing elements such that said conducting support is in electrical communication with a second surface of a lasing element from each pair of lasing elements; and two thermally and electrically conducting end supports, each end support individually connected to said second surface of different ones of said lasing elements which are at the end of said array.

2. A linear laser array, comprising:

a thermally conductive base;

at least two thermally conductive grounded supports in thermal contact with said base;

at least two pairs of lasing elements, each lasing element having first and second surfaces in electrical contact with a lasing region, and each pair of lasing elements comprised of two lasing elements whose first surfaces are disposed on opposing sides of one of said thermally conductive grounded supports such that said second surfaces are adjacent said thermally conductive insulating supports;

at least four electrical contacts, each one of said contacts in electrical communication with a second surface of a single lasing element;

a thermally conducting and electrically insulating support disposed between pairs of lasing elements such that said insulating support is adjacent to two electrical contacts, one from each of said at least two pairs of lasing elements; and two thermally conducting and electrically insulating end supports, each end support individually adjacent to said second surface of different ones of said lasing elements which are at the end of said array.

3. A laser array comprising:

a thermally conductive support having a spacer with a plurality of defined support surfaces;

a plurality of lasing elements, each of said lasing elements mounted adjacent to, and in thermal contact with, an individual one of said support surfaces; and an electrically insulating film disposed between at least one of said lasing elements and support surface;

wherein dimensions of said spacer and said insulating film controls the spacing between two of said lasing elements.

4. A laser array comprising:

a thermally conductive T shaped support with defined support surfaces; and a plurality of lasing elements mounted adjacent to, and in thermal contact with, said support surfaces;

wherein said T shaped support includes a relief for reducing interference between said T shaped support and a corner of at least one of said lasing elements; and wherein a dimension of said T shaped support controls the spacing between at least two of said lasing elements.

5. The laser array according to claim 4 wherein said T shaped support is electrically conducting.

6. The laser array according to claim 5, further including an electrically insulating film between at least one of said lasing elements and a support surface.

7. The laser array according to claim 4, further including an electrically conductive layer over at least one of said support surfaces.

8. The laser array according to claim 7, further including an electrically insulating film between at least one of said lasing elements and a support surface.

9. A laser array comprising:

a thermally conductive cross-shaped support having a spacer with defined support surfaces; and a plurality of lasing elements mounted on, and in thermal contact with, said cross-shaped support surfaces;

wherein a dimension of said spacer controls the spacing of said lasing elements, and said cross-shaped support includes a relief for reducing interference between said cross-shaped support and a corner of one of said lasing elements.

10. The laser array according to claim 9, wherein said cross-shaped support is electrically conducting.

11. The laser array according to claim 9, further including an electrically conductive layer over at least one of said support surfaces.

12. A laser array comprising:

a thermally conductive cross-shaped support having a spacer with defined support surfaces;

a plurality of lasing elements mounted on, and in thermal contact with, said cross-shaped support surfaces; and an electrically insulating film between at least one of said lasing elements and a surface of said cross-shaped support;

wherein a dimension of said spacer controls the spacing of said lasing elements.

13. A laser array comprising:

a thermally conductive cross-shaped support having a spacer with defined support surfaces; and a plurality of lasing elements mounted on, and in thermal contact with, said cross-shaped support surfaces;

wherein a dimension of said spacer controls the spacing of said lasing elements, said cross-shaped support is electrically conducting, and said support includes a relief for reducing interference between said support and a corner of one of said lasing elements.

14. The laser array according to claim 13, further including an electrically insulating film between at least one of said lasing elements and a support surface.

15. A laser array comprising:

a thermally conductive cross-shaped support having a spacer with defined support surfaces;

a plurality of lasing elements mounted on, and in thermal contact with, said cross-shaped support surfaces;

an electrically conductive layer over at least one of said support surfaces; and an electrically insulating film between at least one of said support surfaces;

wherein a dimension of said spacer controls the spacing of said lasing elements.

16. A laser array, comprising:

a thermally conductive support having a spacer with defined support surfaces; and a plurality of lasing elements soldered to said support surfaces;

wherein the width of said spacer controls the spacing of said lasing elements, and at least one of said lasing elements is soldered to said support surfaces by:

immersing indium pellets used in a solvent;

depositing solvent immersed indium onto at least one of said support surfaces using thermal evaporation;

bringing the lasing elements into close proximity with the indium solder deposited on said at least one support surface;

raising the temperature of said at least one support surface above the melting temperature of the deposited indium; and pressing a lasing element onto said at least one support surface.

* * * * *